United States Patent [19]

Rogers et al.

[11] 4,210,964
[45] Jul. 1, 1980

[54] DYNAMIC VISUAL DISPLAY OF RESERVOIR SIMULATOR RESULTS

[75] Inventors: William L. Rogers, Rijswijk, Netherlands; Paul A. Good, Houston; Richard A. Smith, Missouri City, both of Tex.

[73] Assignee: Shell Oil Company, Houston, Tex.

[21] Appl. No.: 870,231

[22] Filed: Jan. 17, 1978

[51] Int. Cl.[2] .......................... G06F 15/36; H04N 7/18
[52] U.S. Cl. .................................. 364/578; 364/715; 367/70; 358/104
[58] Field of Search ............... 364/578, 700, 715, 803, 364/300, 804; 340/15.5 SS; 358/104 DS

[56] References Cited

U.S. PATENT DOCUMENTS

| 3,684,872 | 8/1972 | Clauset, Jr. et al. | 364/804 |
| 3,952,282 | 4/1976 | Zemanek, Jr. | 340/15.5 DS |

FOREIGN PATENT DOCUMENTS 7212965  3/1973  Netherlands ...................... 340/15.5 SS

OTHER PUBLICATIONS

Good, Rogers et al.: Use of color movies for interpretation and presentation of reservoir simulation results, Society of Petroleum Engineers of AIME, SPE 7420 (Annual conference), Oct. 1978.
Spivak et al.: Solution of the equations for multidimensional, two-phase, immiscible flow by variational methods, Journal, Society of Petroleum Engineers, vol. 17, No. 1, Feb. 1977.
Settari et al.: Development and application of variational methods for simulation of miscible displacement in porous media, Journal, Soc. of Petroleum Eng., vol. 17, No. 3, Jun. 1977.
Toronyi et al.: Two-phase, two-dimensional simulation of a Geothermal reservoir, Journal, Society of Petroleum Engineers, vol. 17, No. 3, Jun. 1977.
Thomas et al.: Three-dimensional geothermal reservoir simulation, Journal, Society of Petroleum Engineers, vol. 18, No. 2, Apr. 1978, pp. 151-161.
Coats, K. H., A highly implicit steamflow model, Journal, Society of Petroleum Engineers, vol. 18, No. 5, Oct. 1978 pp. 369-383.

Primary Examiner—Felix D. Gruber

[57] ABSTRACT

A method and apparatus for producing a dynamic display of the response of a petroleum reservoir to a particular recovery process. The method comprises the steps of developing a mathematical simulation of the response of the formation and forming a visual display of said simulation for each of a plurality of preset time intervals. A predetermined number of frames of movie film are taken of each display in proper time sequence. The frames of the movie film are then projected to produce a dynamic display of the response of the formation.

13 Claims, 6 Drawing Figures

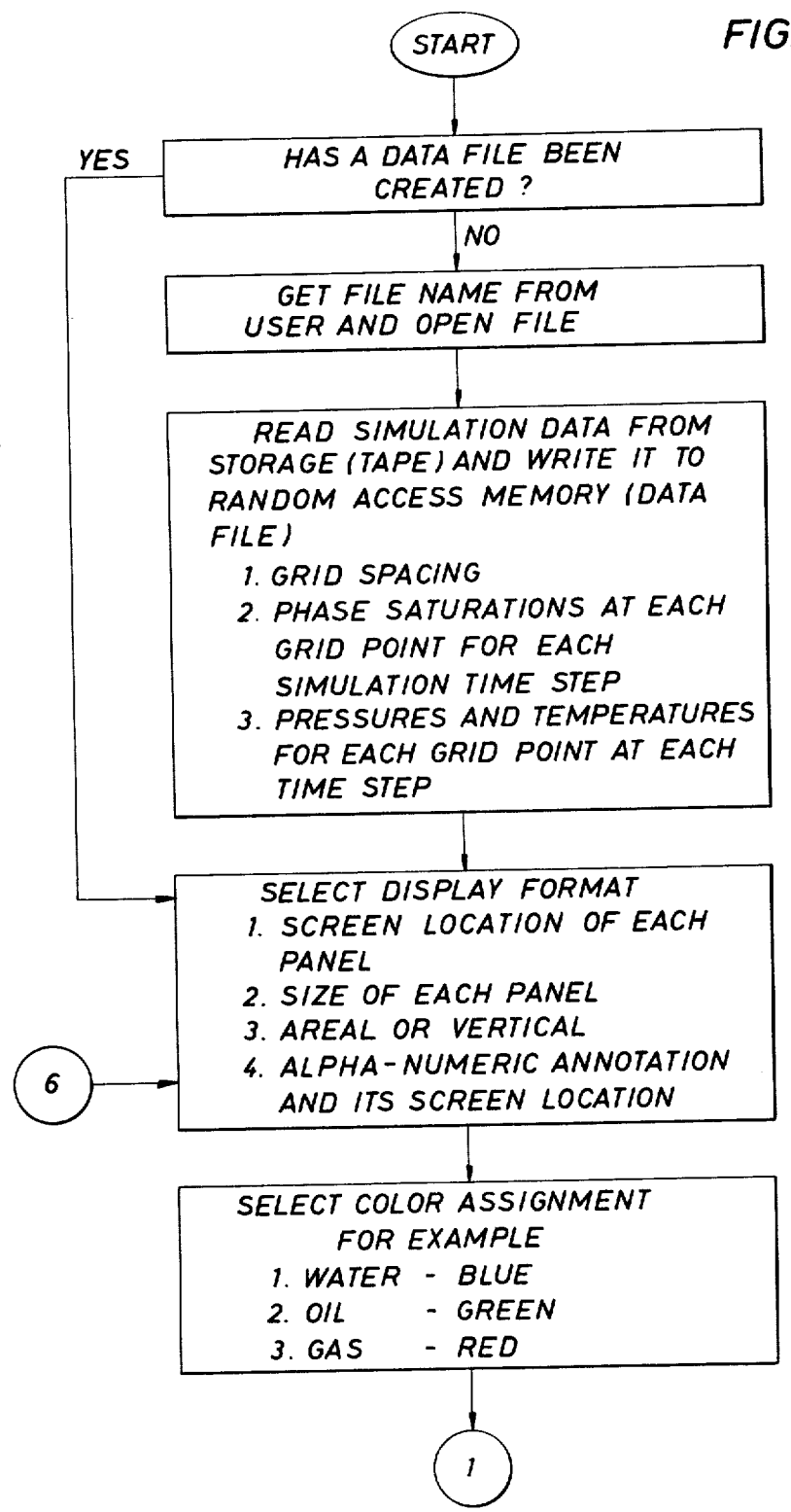

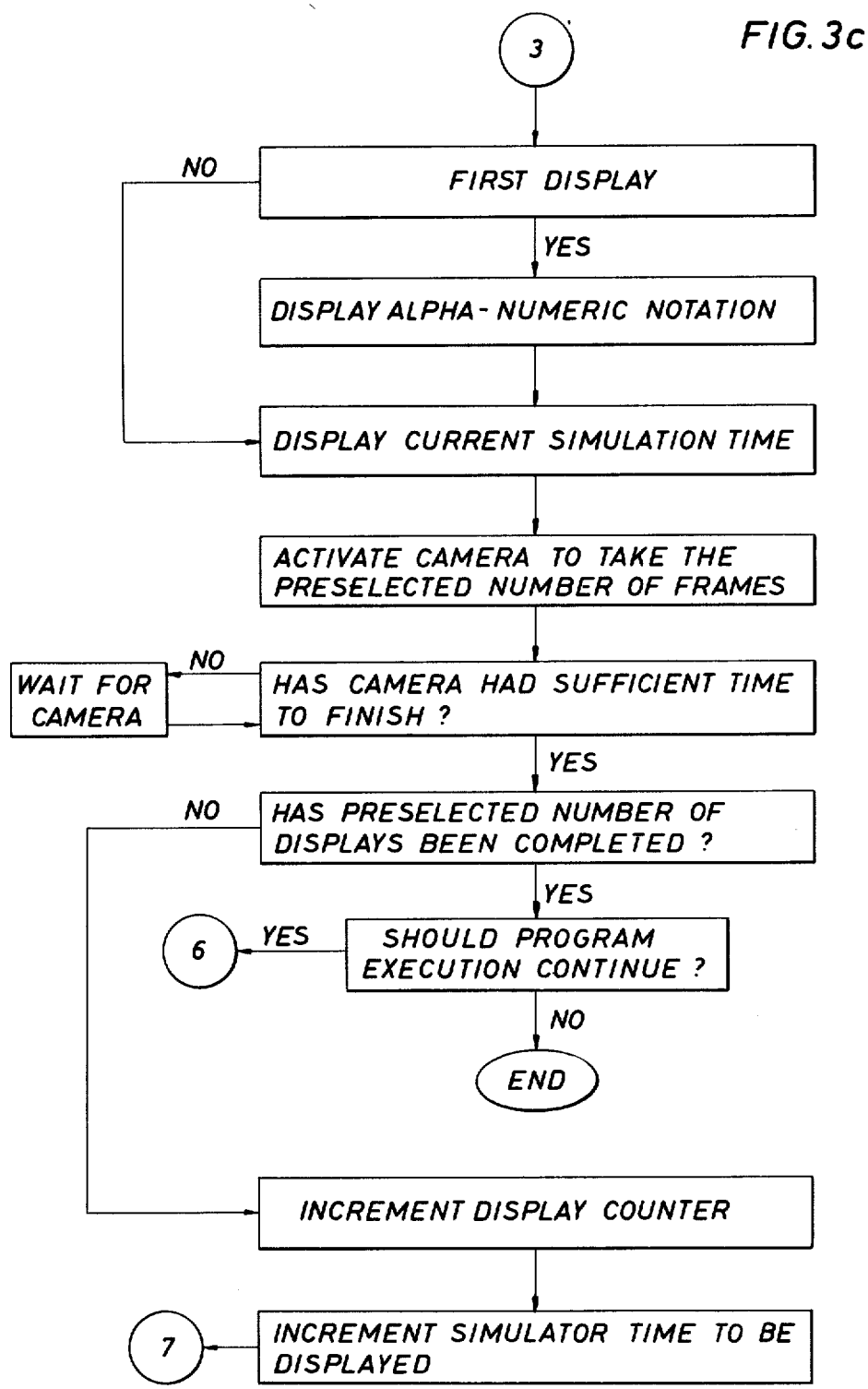

DYNAMIC VISUAL DISPLAY OF RESERVOIR SIMULATOR RESULTS

BACKGROUND OF THE INVENTION

The present invention relates to the recovery of hydrcarbons from petroleum reservoirs, and particularly, the engineering of stimulated recovery processes. The term stimulated recovery process is used to describe both secondary recovery processes, such as water floods, steam floods, and others, as well as tertiary recovery processes, such as chemical floods and miscible floods. Also, the method of the present invention can be used in studying any primary production of a reservoir.

In most reservoir engineering studies of stimulated production of hydrcarbon reservoirs, a mathematical simulation of the reservoir is developed. Mathematical simulation defines the fluid saturation in terms of gas, oils, and perhaps water at various positions and times within the reservoir. The simulation may also determine the temperatures at various locations and times within the reservoir as well as the pressures at the various locations and times in the reservoir. Several methods for constructing mathematical simulations of reservoirs have been described in the literature. For example, the recent book entitled "Modern Reservoir Engineering—A Simulation Approach" by Henry B. Crichlow, published by Printice-Hall, Inc., Englewood Cliffs, N.J. 07632, describes the steps required to develop a mathematical simulation of a reservoir subject to various recovery processes.

In order to construct a mathematical simulation of the reservoir, it is necessary to know the porosity and permeability of the reservoir as well as the areal extent of the reservoir and the locations of the various wells that are used as injection wells and producing wells. Normally, this information is available from the original logs of the wells and subsequent production of the reservoir. Using this information and other related data, it is possible to construct a mathematical simulation of the reservoir.

The accuracy of the mathematical simulation of a reservoir can then be checked against the history of the reservoir after it is subjected to the simulated recovery process. The production history of the reservoir will allow the engineer to refine his mathematical simulation, and with the refined mathematical simulation, predict the future performance of the reservoir and locate possible problem areas.

While the above approach to reservoir engineering is well-known, several problems confront the engineer. For example, while the mathematical simulation will provide the distribution of reservoir parameter values throughout the reservoir at any particular time, this distribution has been typically displayed in the form of (1) arrays of numbers or (2) a line-printed plot from a computer printer or (3) output from off-line plotters. Of course, these plots are only two-dimensional plots and will represent either the distribution of reservoir parameter values over an areal extent of the reservoir or along a surface which is substantially vertical to the reservoir formation. While plots can be constructed for any point in time, it is difficult to analyze these plots to detect the location of problem areas or to analyze how rapidly events are taking place in the reservoir. These difficulties are caused primarily by the fact that each plot is a static display and the change from one plot to the succeeding plot is very small if relatively short time intervals are used. If longer time intervals are used, the changes will be shown but their development and possible cause will not be apparent.

BRIEF SUMMARY OF THE INVENTION

The present invention solves the above problems by providing a method by which a dynamic display may be formed from the mathematical simulation of the formation which permits the engineer to view the change in various formation parameters in a relatively brief time interval, and thus, appreciate the changes in the parameters as they occur. The term parameter includes fluid distribution within the reservoir, the temperature distribution, and the pressure within the reservoir or other conditions. The dynamic display may indicate the changes in the parameter along a surface which is at right angles to the formation or along a surface which is parallel to the areal extent of the formation. The particular surface in the formation chosen for the dynamic display will, of course, depend upon the mathematical simulation of the formation and the desires of the engineer.

Although line-printer plots had been suitable for static displays, early attempts at dynamic displays of these plots were found to be fundamentally unsatisfactory. The plot format consisted of a cross-sectional area which was partitioned into sites or locations, and imprinted on each site was an alpha-numeric symbol to represent the magnitude of the variable displayed. In some cases, a statistical technique was used to determine the frequency of occurrence of symbols in these sites. These plots were found to be fundamentally unsuitable for dynamic display because the eye could not analyze the distribution of alpha-numeric symbols in the short time available for each display. Movies of formats such as these presented a seemingly erratic, dynamic jumble of symbols. A large improvement was achieved when a color was assigned to each site so that continuous changes in magnitude of variables were represented by continuous changes in color (tint), intensity, and saturation (perceived whiteness) at each site.

Preliminary to the implementation of the method of the invention, then, a mathematical simulation of the reservoir must be developed using techniques well known in the art and values of the selected reservoir parameters at various loctions and times must be computed. As mentioned in the 'Background', several methods for constructing mathematical simulations of reservoirs have been described in the literature. In the method of the invention, the computed values for the various times are stored in a medium from which they can be recovered when desired; for example, the information may be stored on a magnetic tape or discs. The stored information is then supplied to a second computer which is programmed to format the data so that it can be used to form a static display. In general, the formatting program interpolates between the computed reservoir parameter values in both time and space to form the display. In addition, the computer program is designed to assign various colors to various values of the parameter. For example, the color blue could be assigned to water, whlie green is assigned to oil, and red assigned to vapor or gas in the formation. Thus, in the case of a steam flood, progress of the steam flood through the formation and the sweeping of the oil from the formation could be dynamically displayed. In a simiar manner, various colors could be assigned to various temperature ranges or various pressure ranges. Once the computed values of the fluid distribution are presented in the proper format and the proper colors assigned, the signals can be supplied to a display system which then controls the graphic display of the information on a conventional television monitor. The formatting computer then triggers the movie camera that exposes a set number of frames of movie film to photograph the graphic display.

The process is continued in a sequence of time intervals so selected as to produce a dynamic display of the progress or the variation of a formation parameter. For example, in a steam flood, which is expected to last for seven to ten years, it was found satisfactory to display the variations in the parameters at three-day intervals by exposing five frames of movie film to each graphic display and then projecting the exposed movie film as a continuous film. One could accurately visualize the progress of the steam flood through the formation using these time intervals.

BRIEF DESCRIPTION OF THE DRAWINGS

The present invention can be more easily understood by the following detailed description of the preferred embodiment when taken in conjunction with the attached drawings in which:

FIGS. 3a, 3b and 3c are flow diagrams of the computer program used to format the data.

PREFERRED EMBODIMENT

The following discussion will relate to a particular petroleum reservoir which is being subjected to a steam drive secondary recovery process. The field is roughly four miles long and slightly less than one mile wide. The field has been divided into four separate sections which compose the four phases of the steam drive. The reservoir has an average porosity of 33% and a gross thickness of approximately 75 feet with an average permeability of about 10 darcies. While the average permeability is about 10 darcies, there are several lower permeability layers having a permeability of about 2 darcies and a higher capillary pressure. The crude has a gravity of about 15° to 16° API and viscosity of about 280 centipoise at a reservoir temperature of 110° F. Downdip of the formation there is an aquifer influx which has been prevented from reaching the updip portion of the formation by high volume pumping.

Figure 1:
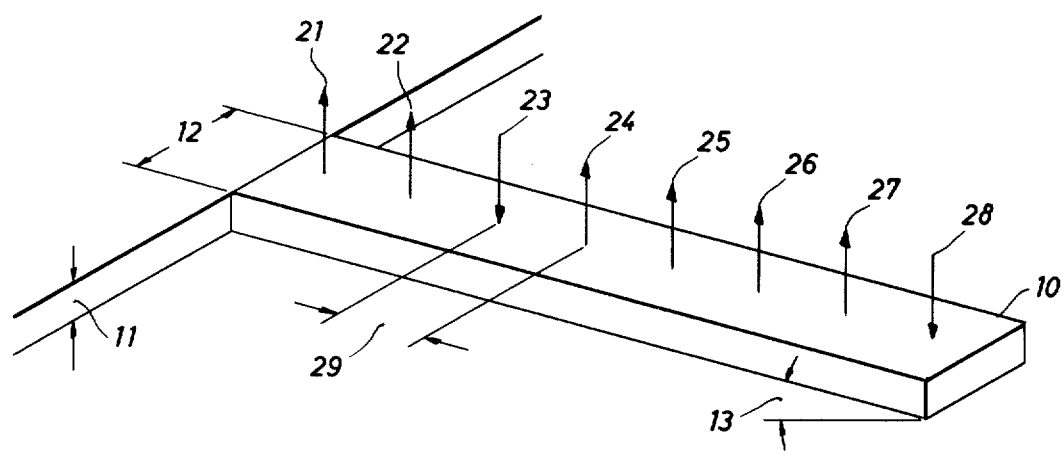
FIG. 1 is a pictorial view of a section of the formation which is used to form the dynamic display.

Referring now to FIG. 1, there is shown a section of the reservoir for which the mathematical simulation is developed. The section shown comprises a line of eight wells 21-28, which extend across the narrow dimension 10 of the reservoir. As shown, the section has a width 12 of roughly 500 feet and a depth 11 of roughly 75 feet. The dip angle 13 is approximately 6° while the distance 29 between the wells is roughly 500 feet. The simulation for the section shown in FIG. 1 was derived by assuming that the well 21 was near the closing fault of the reservoir, and well 28 on the downdip side was near the oil-water contact of the finite aquifer attached to the downdip end of the model. The simulation comprised a two-dimensional cross-section having eighteen horizontal divisions and six vertical layers with three of the layers being about 2 darcies of permeability, and the three remaining layers being 10 darcies permeability. The steam was initially injected into both the updip injector 23 and the downdip injector 28 with the updip injection supplying the main drive mechanism. The downdip injection was for the purpose of supplying heat to the lower portion of the reservoir to prevent the formation of a cold oil bank which could stall the drive process. After sufficient heating was obtained, the downdip injection was shut in, and natural water influx from the aquifer was used to move the heat and the oil bank formed by the downdip injection towards the wells 25 and 26.

Figure 2:
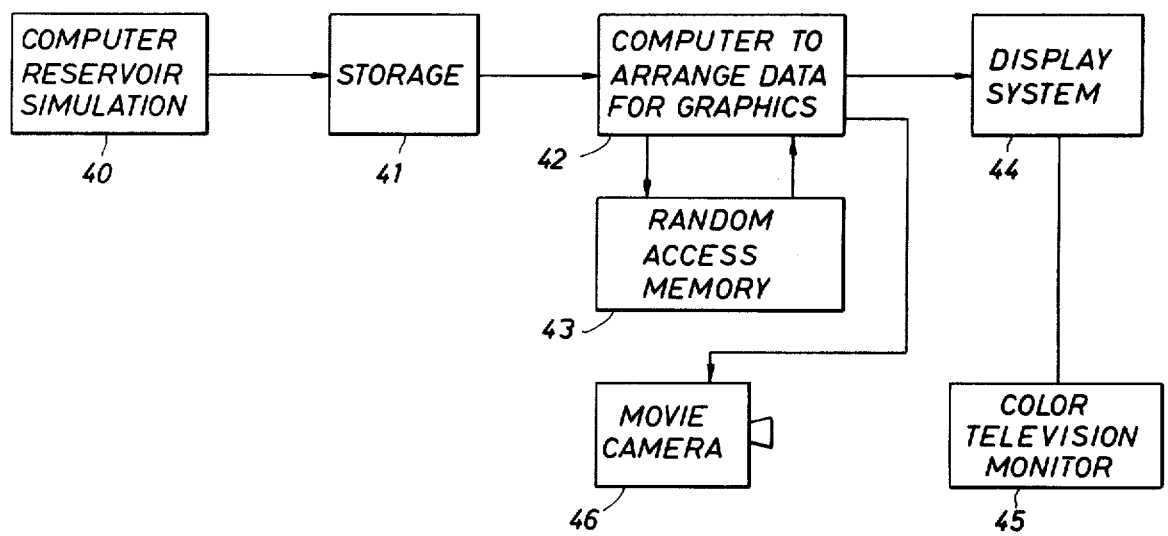
FIG. 2 is a block diagram showing the apparatus used for carrying out the method of the present invention.

After the mathematical simulation of the section of the reservoir shown in FIG. 1 was derived by methods well known in the art, the values of the fluid distribution, temperature distribution, and pressure distribution, along a coordinate surface were computed for three-day intervals. As shown in FIG. 2, the computer 40 is programmed to utilize the mathematical simulator to calculate the various fluid, temperature, and pressure distributions at the selected time intervals in a conventional manner, using well known techniques. The computed values are then stored in a storage device 41 from which they can be retrieved. As explained, magnetic tape or discs would be a suitable storage medium. Stored data is then supplied to the computer 42 which is utilized to arrange the data in the proper sequence and format it for use by the digital display system 44, as illustrated in FIG. 3a. The computer 42 may be a relatively small computer, such as Harris/Data Craft Model IV manufactured by Harris Corporation, 1200 Gateway Drive, Ft. Lauderdale, Fla. 33309. The display system 44 is a commercial unit which is available under the name Model GCT-3000, Series Graphics Display System from Genisco Computer, 17805D Skypark Circle Drive, Ervine, Calif. 92714. The computer 42, in addition to arranging the data in the proper sequence for use by the display system, also assigns the proper colors to the data depending upon the value or amplitude of the data in the case of temperature and pressure and the fluid saturation in the case of a fluid distribution, as shown in FIG. 3a.

Figure 3B:
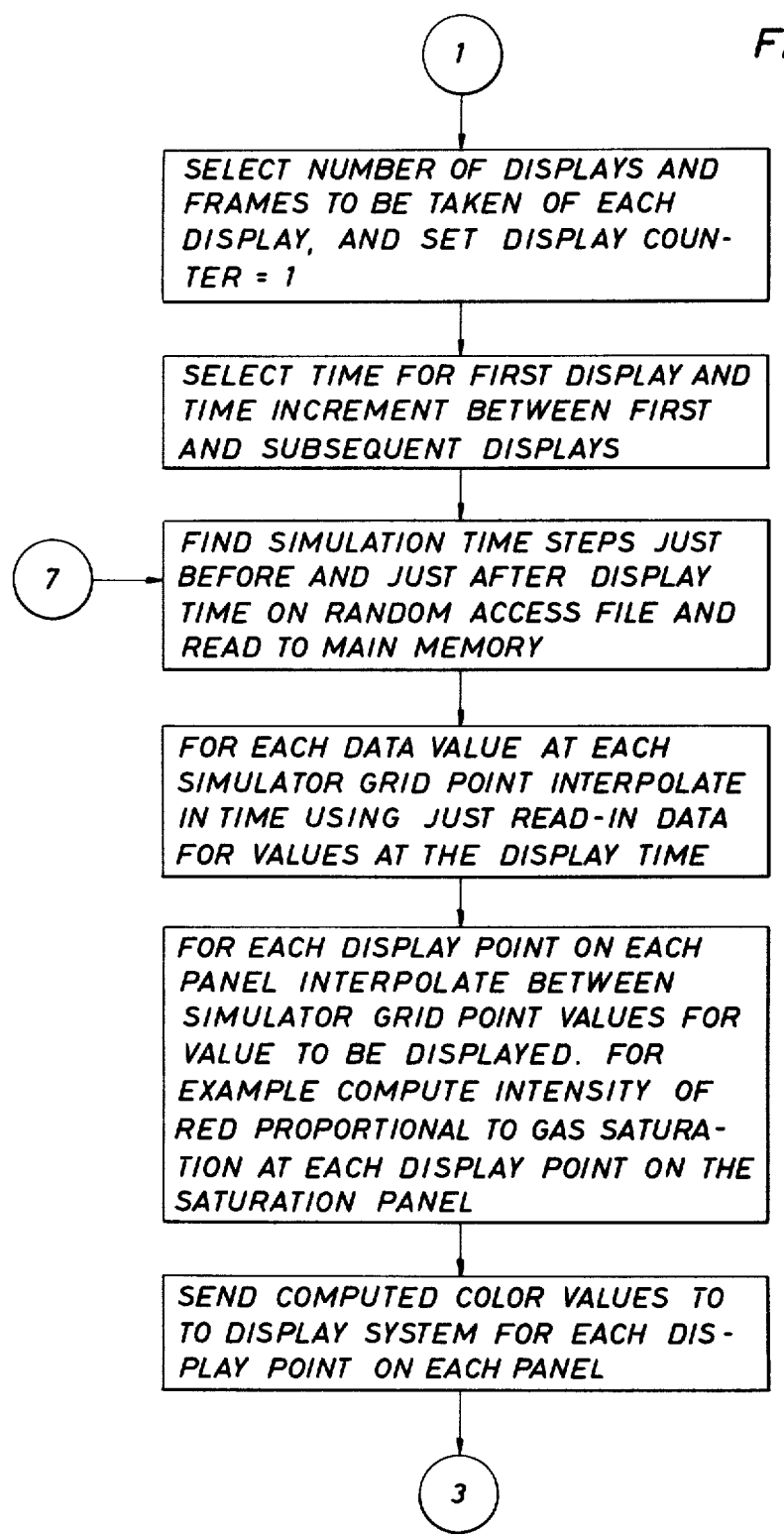

Referring to FIGS. 3a, 3b and 3c the flow diagram for programming the computer 42 is shown. The program is designed to select the data to be displayed, arrange it in the proper form, and assign the proper colors. The program also controls the display system 44 and the operation of the movie camera 46.

The display system 44 then displays the data on a color television monitor 45 as a graphic display. The display system 44 has a capability of refreshing the display on the color television monitor at required intervals so that it appears as a static picture. The computer 42, in addition to arranging the data in the proper sequence, also controls a movie camera 46 that is positioned to photograph the display on the television monitor, as shown in FIG. 3c. Normally, the computer 42 will trigger the movie camera after the display is made and the movie camera will expose a preselected number of frames of movie film. As explained, excellent results have been obtained by exposing five frames for each graphic display on the color television monitor. After the movie film is exposed and after all the static displays have been photographed by the movie camera, the film can be developed and displayed as a conventional movie.

While in the example, static displays were produced at three-day intervals and five frames of film exposed for each display, these parameters may vary over a wide range. Acceptable results have been obtained by producing a five to ten minute movie for each simulation. The length of the finished movie can be controlled by varying the time intervals between static displays and the number of frames of film exposed. As a general rule, when changes are occurring at a rapid rate, the time period between static displays should be reduced and the number of frames of film exposed should also be reduced. It may be desirable to vary both the time between displays and the number of frames exposed during a simulation to provide a clear presentation of the changes that occur in the reservoir. In actual practice, the number of frames exposed per display has varied between one and ten frames. The time interval between displays has varied from one-tenth of a day to as high as thirty days. Normally, one would select a time between displays based on length of the simulation divided by 7 to 10 minutes. This would provide the years per minute that can be converted to time intervals per frame by dividing by 1440, representing the total frames per minute. The time interval between displays can be obtained by multiplying the years per minute by 365, multiplying the result by the number of frames per display, then dividing the result by the total frames per minute.

Figure 4:
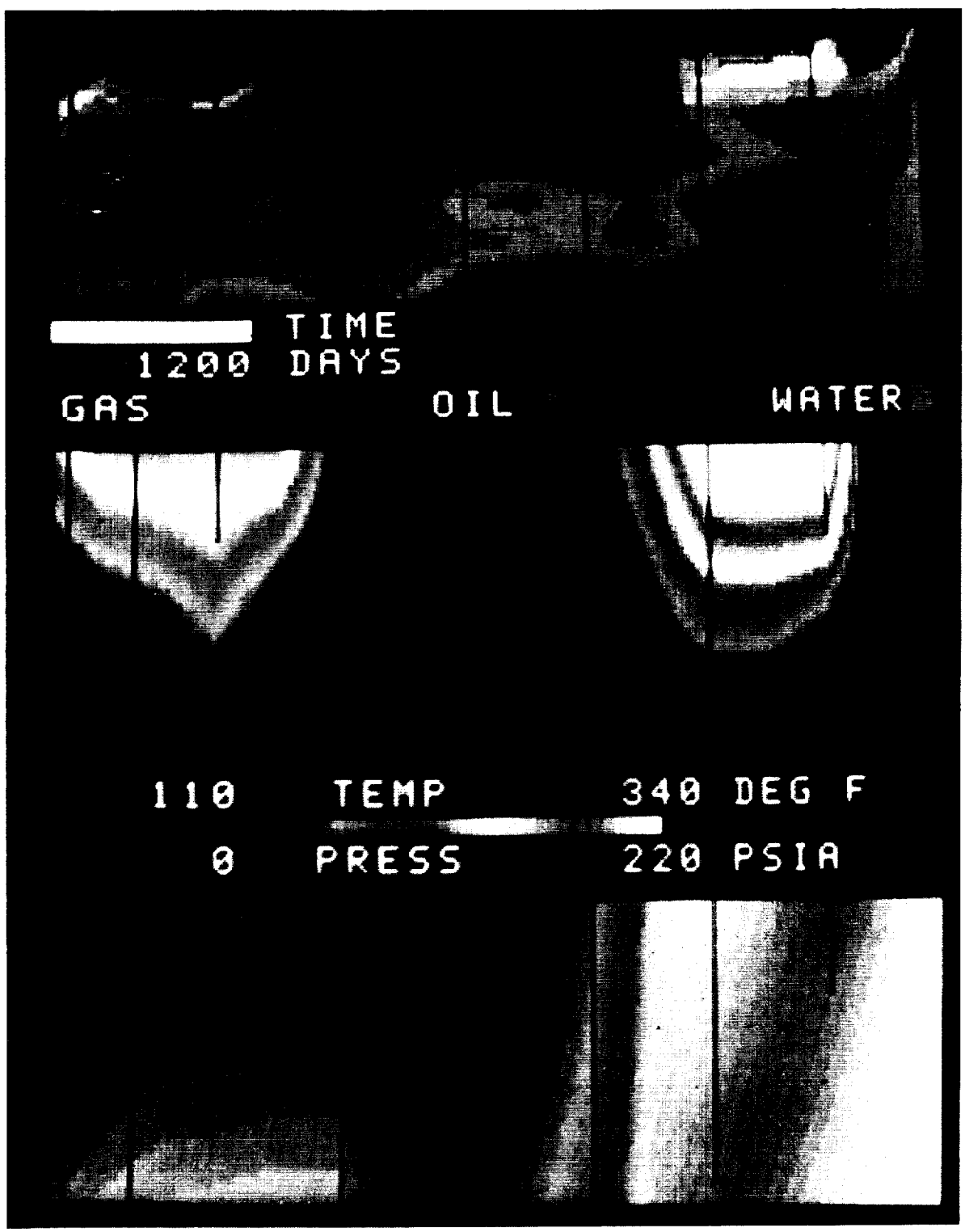
FIG. 4 is a reproduction of one frame of the movie film.

An example of one frame of the film is shown in FIG. 4. As shown in FIG. 4, the fluid distribution, temperature distribution, and pressure distribution in the reservior are displayed in three separate displays. In addition, time is displayed as a lengthening bar between the fluid saturations and temperature distribution displays. The displays are formed with the well 21 on the left and well 28 on the right, and the scale between the vertical and horizontal dimensions is 20 to 1. Obviously, it would be impossible to display a 75-foot-thick reservoir having approximately a 5000-foot length on a conventional movie film and obtain a useful display of the information. Thus, it is necessary to, in effect, shorten the scale of the horizontal dimension while lengthening vertical scale. Of course, in the case of an areal display substantially parallel to the surface of the reservoir, it would probably be possible to form a display on a 1-to-1 ratio between the width and length of the reservoir. In referring to a plane substantially parallel to the surface of the reservoir, of course, the plane would actually conform to the particular characteristics of the reservoir and would not necessarily be a horizontal plane or a parallel surface of the reservoir throughout its complete areal extent.

What is claimed is:

1. In a method for producing a dynamic visual display of the variation with time along a surface of physical characteristics of a producing petroleum reservoir wherein the magnitude of each characteristic is calculated for each of a series of times, a series of steps comprising:

assigning color (tint), intensities and saturations (perceived whiteness) to variuos values of the magnitude of each characteristic;

producing for each one of said series of times a visual display of the variation in the magnitude of each characteristic along the surface using the assigned color, intensity, and saturation, to represent the magnitude of the characteristic;

forming a separate photographic record of said visual display for each of said series of times; and, displaying a sequence of said photographic records to form a dynamic display of the variation with time along said surface of said variation.

2. The method of claim 1 wherein said photographic record comprises a predetermined number of frames of movie film.

3. The method of claim 1 wherein the interval between each of said series of times is chosen to insure the dynamic presentation of changes in said physical characteristics.

4. The method of claim 1 wherein the physical characteristic is the value of the fluid saturation and composition distribution in the reservoir.

5. The method of claim 4 wherein the reservoir is subjected to a secondary recovery process, and the values of the fluid saturation and composition distributions for each of a series of times provide at least 100 visual displays during the projected life of the secondary recovery process.

6. The method of claim 5 wherein the physical characteristic includes the pressure and temperature distribution along the surface for each value of the fluid saturation and composition distributions, said pressure and temperature distributions being positioned on said visual displays in an aligned position with the fluid saturations and composition distributions.

7. The method of claim 6, and in addition, displaying time on said visual displays as a bar graph whose length increases as the total time increases.

8. The method of claim 7 wherein between one and ten frames of movie film are exposed for each display.

9. The method of claim 1, wherein the physical characteristics calculated for each of a series of times provide at least 100 visual displays during the projected life of the producing petroleum reservoir.

10. In a method for producing a dynamic visual display of the variation with time along a surface of the change in a variable of a petroleum reservoir subjected to a recovery process wherein the values of one of said reservoir variables at a plurality of locations along the surface are calculated for each of a series of times, a series of steps comprising:

assigning colors to the relative magnitude of the reservoir variables of interest;

producing for each one of said series of times a visual display of at least one reservoir variable along said surface using a mixture of the assigned colors at each location to represent relative magnitude of the said reservoir variables;

forming a plurality of separate photographic records of said visual displays for each of said series of times; and, displaying a sequence of said photographic records to form a dynamic display of the variation with time of said reservoir variables along said surface.

11. The method of claim 10 wherein said plurality of separate photographic records are formed by exposing a predetermined number of frames of a motion picture film of each visual display, the motion picture film of all the visual displays being displayed as a conventional motion picture to produce the dynamic display of said at least one reservoir variable.

12. The method of claim 11 in which the reservoir variable is the calculated fluid saturation and composition distributions obtained for each of a series of times.

13. The method of claim 12 wherein said series of times are separated by equal predetermined time intervals.

* * * * *